United States Patent [19]

Van Roessel

[11] Patent Number: 4,523,109
[45] Date of Patent: Jun. 11, 1985

[54] DIFFERENTIAL AMPLIFIER FILTER CIRCUIT HAVING EQUAL RC PRODUCTS IN THE FEEDBACK AND OUTPUT LOOPS

[75] Inventor: Frederik J. Van Roessel, Upper Saddle River, N.J.

[73] Assignee: U.S. Philips Corporation, New York, N.Y.

[21] Appl. No.: 435,425

[22] Filed: Oct. 20, 1982

[30] Foreign Application Priority Data

Nov. 20, 1981 [NL] Netherlands ............... 8105255

[51] Int. Cl.³ .................................. H03H 11/12
[52] U.S. Cl. ..................... 307/520; 307/271; 328/138; 328/167; 330/294; 330/306
[58] Field of Search ............ 307/510, 514, 516, 520, 307/521-523, 525, 526, 529, 271; 328/21, 134, 138, 141, 167; 330/107, 109, 192, 294, 302, 306

[56] References Cited

U.S. PATENT DOCUMENTS

| 3,564,441 | 2/1971 | Eide ...................... 330/302 |
| 3,824,496 | 7/1974 | Hekimian ................ 330/107 X |
| 3,886,469 | 5/1975 | Rollett et al. ............ 328/167 X |
| 4,051,385 | 9/1977 | Greenaway et al. ....... 307/520 |
| 4,122,417 | 10/1978 | Takasaki et al. .......... 330/107 X |
| 4,458,212 | 7/1984 | Brehmer et al. .......... 330/294 X |

OTHER PUBLICATIONS

Shepard, "Active Filters: Part 12—Short Cuts to Network Design", Electronics, Aug. 1969, pp. 82-92.
Hills, "Active Filters: Part 13—Narrowing the Choice", Electronics, Oct. 1969, pp. 105-111.

Primary Examiner—Stanley D. Miller
Assistant Examiner—D. R. Hudspeth
Attorney, Agent, or Firm—Thomas A. Briody; William J. Streeter

[57] ABSTRACT

A filter circuit which operates as a substantially optimum integrating circuit comprises input and output terminals and a differential amplifier, the amplifier having an inverting input connected to the output via a series circuit including a first capacitor and a first resistor. The amplifier output is coupled via a series circuit of a second resistor and a second capacitor to a terminal carrying a reference voltage. The non-inverting input to the amplifier has a DC connection to the reference voltage terminal. One input to the filter circuit connects to the reference voltage terminal, the other filter circuit input being in circuit with the inverting input to the amplifier. The junction between the second resistor and the second capacitor connects to the filter circuit output terminal. The RC time constant of the first capacitor and the first resistor is substantially equal to the RC time constant of the second capacitor and the second resistor.

2 Claims, 1 Drawing Figure

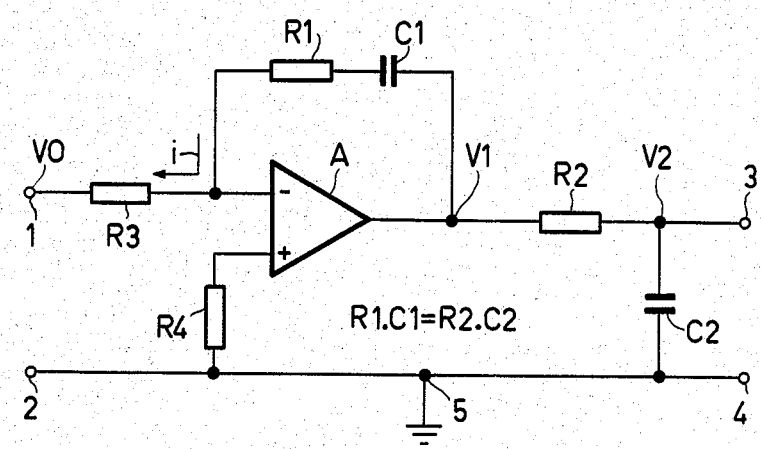

DIFFERENTIAL AMPLIFIER FILTER CIRCUIT HAVING EQUAL RC PRODUCTS IN THE FEEDBACK AND OUTPUT LOOPS

BACKGROUND OF THE INVENTION

The invention relates to a filter circuit comprising input and output terminals and a differential amplifier, said amplifier having a (−) inverting input being connected to the output via a series circuit including a first capacitor and a first resistor, the output of said amplifier being coupled via a series circuit of a second resistor and a second capacitor to a terminal carrying a reference voltage, the (+) non-inverting input to the amplifier having a DC connection to said reference voltage terminal, one said input to said filter circuit being connected to said reference terminal, the other input to said filter circuit being in circuit with said (−) inverting input to said amplifier, the junction between the second resistor and the second capacitor being connected to said output terminal of the filter circuit.

Such a filter circuit is described in the periodical "IEEE Transactions on Consumer Electronics", Volume CE-26, August 1981, pages 303 and 304. Amplitude modulation is mentioned there as a field of application of the filter circuit, the differential amplifier and the first capacitor and resistor operating as an active filter and the second capacitor and resistor operating as a capacitor-resistor filter. The filter circuit may be incorporated in a phase-locked loop circuit.

SUMMARY OF THE INVENTION

The invention has for its object to use the filter circuit in a different field, in which field the circuit operates in a substantially ideal manner. According to the invention, a filter circuit is therefore characterized in that the product of the values of the first capacitor and the first resistor are substantially equal to the product of the values of the second capacitor and the second resistor.

The invention is based on the recognition that for the described structure of the filter circuit the choice of the substantially equal time constants of the first and second capacitors and resistors results in a substantially ideal, optimum signal integration.

The optimum signal integration can be obtained with the least possible number of components having different values in a circuit which is further characterized in that the value of the first capacitor and resistor, respectively is substantially equal to the value of the second capacitor and resistor, respectively.

BRIEF DESCRIPTION OF THE DRAWING

The invention will now be further described by way of example with reference to the accompanying drawing whose sole FIGURE shows a circuit in accordance with the invention.

DESCRIPTION OF THE PREFERRED EMBODIMENT

In the FIGURE two input terminals of the circuit in accordance with the invention are denoted by reference numerals 1 and 2 and two output terminals by reference numerals 3 and 4. A denotes a differential amplifier which has a (−) inverting input, a (+) non-inverting input and an output. The (−) inverting input is connected to the amplifier output via a series arrangement of a resistor R1 and a capacitor C1. The positions of the resistor R1 and the capacitor C1 may be interchanged. The amplifier output is connected, via a resistor R2, to the output terminal 3 of the circuit which is further connected to the terminal 4 via a capacitor C2. The input of the amplifier terminal 1 is connected to the (−) inverting input via a resistor R3. The (+) non-inverting input of the amplifier A is connected to the terminal 2 via a resistor R4. The terminals 2 and 4 are connected to a terminal 5, which is connected to ground and carries the ground potential as a reference voltage. At the input terminal 1 it is shown that a voltage V0 is applied to it, the amplifier output supplying a voltage V1 which results in a voltage V2 at the junction between the resistor R2 and the capacitor C2 and on the output terminal connected thereto.

The FIGURE further shows that it must hold that R1C1=R2C2, wherein R1 and R2 represent the values of the similarly indicated resistors and C1 and C2 the values of the similarly indicated capacitors. The equal time constants R1C1 and R2C2 result in the circuit shown in the FIGURE operating as a substantially ideal, optimum signal-integrating circuit. Herein it may hold that R1=R2 and C1=C1.

To explain that the signal integration is substantially ideal and optimum the following holds. Let it be assumed that the gain factor and the input impedances of the amplifier A are very high, a positive current i flowing from the amplifier output via the capacitor C1 and the resistors R1 and R3. The resistor R4 may be omitted when the offset obtained therewith at the amplifier A is not desired. The resistors R3 and R4 have, for example, equal values when the voltage V0 (which is assumed to be negative is obtained from a substantially ideal voltage source.

For the value of the voltage V1 it now holds that:

$$V1 = i \cdot \left( R1 + \frac{1}{jwC1} \right) \tag{1}$$

w being the radial frequency.

The voltage distribution over the resistor R2 and the capacitor C2 results for the voltage V2 in:

$$V2 = \frac{1/jwC2}{R2 + \frac{1}{jwC2}} V1 \tag{2}$$

If now it holds that R1=R2 and C1=C2     (3)

it follows from the relations (1), (2) and (3) that:

$$V2 = i \cdot \frac{1}{jwC2} \tag{4}$$

The relation (4) indicates an ideal (optimum) integration.

From the relations (1) and (2) it can be derived that:

$$V2 = i \cdot \frac{1}{jwC1} \cdot \frac{1 + jwR1C1}{1 + jwR2C2} \tag{5}$$

If now it holds that: R1C1=R2C2     (6)

it follows from the relations (5) and (6) that:

$$V2 = i \cdot \frac{1}{jwC1} \quad (7)$$

Also the relation (7) indicates an ideal (optimum) integration.

It has been found that an ideal (optimum) integration can be obtained when the time constants $R1C1$ and $R2C2$ are chosen equal or if it holds for the resistance values that $R1=R2$ and for the capacitor values that $C1=C2$. The last solution is the most simple solution when the least possible number of components having different values are used. If unequal values are chosen, the value $R1$ can be chosen such that a desired gain factor is obtained and the value $R2$ can be chosen such that a desired output impedance is obtained, the values $C1$ and $C2$ must then be adapted thereto.

What is claimed is:

1. A filter circuit comprising input and output terminals and a differential amplifier, said amplifier having a (−) inverting input, a (+) non-inverting input and an output, the (−) inverting input being connected to the output via a series circuit including a first capacitor and a first resistor, the output of said amplifier being coupled via a series circuit of a second resistor and a second capacitor to a terminal carrying a reference voltage, the (+) non-inverting input to the amplifier having a DC connection to said reference voltage terminal, one said input to said filter circuit being connected to said reference voltage terminal, the other input to said filter circuit being coupled to said (−) inverting input to said amplifier, the junction between the second resistor and the second capacitor being connected to said output terminal of the filter circuit, the RC time constant of the first capacitor and the first resistor is substantially equal to the RC time constant of the second capacitor and the second resistor.

2. A filter circuit as claimed in claim 1, wherein the values of the first capacitor and resistor, respectively are substantially equal to the values of the second capacitor and resistor, respectively.

* * * * *